(12) United States Patent
Saitoh et al.

(10) Patent No.: US 10,147,874 B2
(45) Date of Patent: Dec. 4, 2018

(54) MEMORY DEVICE

(71) Applicant: Toshiba Memory Corporation, Minato-ku (JP)

(72) Inventors: Masumi Saitoh, Yokkaichi (JP); Takayuki Ishikawa, Yokkaichi (JP); Takashi Tachikawa, Yokkaichi (JP); Marina Yamaguchi, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/707,028

(22) Filed: Sep. 18, 2017

(65) Prior Publication Data

US 2018/0269390 A1 Sep. 20, 2018

(30) Foreign Application Priority Data

Mar. 17, 2017 (JP) ................. 2017-052772

(51) Int. Cl.
*H01L 45/00* (2006.01)
*H01L 27/24* (2006.01)

(52) U.S. Cl.
CPC ........ *H01L 45/085* (2013.01); *H01L 27/2481* (2013.01); *H01L 45/1233* (2013.01); *H01L 45/1266* (2013.01); *H01L 45/147* (2013.01); *H01L 45/1616* (2013.01); *H01L 45/1641* (2013.01)

(58) Field of Classification Search
CPC ..... H01L 45/08; H01L 45/085; H01L 45/146; H01L 45/147; H01L 45/1233; H01L 45/1266
See application file for complete search history.

(56) References Cited

U.S. PATENT DOCUMENTS

| | | | | |
|---|---|---|---|---|
| 7,400,522 B2* | 7/2008 | Toda | ................. | G11C 13/0004 365/148 |
| 7,763,880 B2* | 7/2010 | Williams | ........... | G11C 13/0009 257/105 |
| 7,796,416 B2 | 9/2010 | Ishihara et al. | | |
| 8,362,457 B2* | 1/2013 | Kim | ................... | G11C 13/0007 257/4 |
| 8,766,228 B2 | 7/2014 | Yang et al. | | |
| 8,766,233 B2* | 7/2014 | Sakotsubo | ........ | H01L 21/02183 257/4 |

(Continued)

FOREIGN PATENT DOCUMENTS

| | | |
|---|---|---|
| JP | 2007-180202 | 7/2007 |
| JP | 3989506 | 10/2007 |

(Continued)

*Primary Examiner* — Allison P Bernstein
(74) *Attorney, Agent, or Firm* — Oblon, McClelland, Maier & Neustadt, L.L.P.

(57) ABSTRACT

A memory device according to an embodiment includes a first conductive layer, a second conductive layer; and a first metal oxide layer provided between the first conductive layer and the second conductive layer. The first metal oxide layer includes titanium oxide, the first metal oxide layer has a first region and a second region, a mole fraction of anatase titanium oxide in the titanium oxide of the first region is a first mole fraction, and a mole fraction of anatase titanium oxide in the titanium oxide of the second region is a second mole fraction lower than the first mole fraction.

17 Claims, 12 Drawing Sheets

(56) References Cited

U.S. PATENT DOCUMENTS

| | | |
|---|---|---|
| 9,202,845 B2 | 12/2015 | Saitoh et al. |
| 9,412,937 B2 | 8/2016 | Saitoh et al. |
| 2014/0203864 A1 | 7/2014 | Williams |
| 2015/0076439 A1 | 3/2015 | Saitoh et al. |

FOREIGN PATENT DOCUMENTS

| | | |
|---|---|---|
| JP | 5575866 | 8/2014 |
| JP | 5645837 | 12/2014 |
| JP | 2015-60891 | 3/2015 |

\* cited by examiner

FIG.5A    OFF STATE (RESET STATE)

FIG.5B    ON STATE (SET STATE)

FIG.8A   OFF STATE (RESET STATE)

FIG.8B   ON STATE (SET STATE: BEFORE VOLTAGE PASSES THROUGH 0 V)

FIG.8C   ON STATE (SET STATE: AFTER VOLTAGE PASSES THROUGH 0 V)

FIG.12B

MEMORY DEVICE

CROSS-REFERENCE TO RELATED APPLICATION

This application is based upon and claims the benefit of priority from Japanese Patent Application No. 2017-052772, filed on Mar. 17, 2017, the entire contents of which are incorporated herein by reference.

FIELD

Embodiments described herein relate generally to a memory device.

BACKGROUND

A variable resistance memory with two terminals has been developed as a large-capacity non-volatile memory which may replace a floating-gate type NAND flash memory in the future. This type of memory makes it possible to achieve a low-voltage and low-current operation and a high-speed switching, to scale down a memory cell size, and to improve the integrity of memory cells.

Various materials have been proposed as the material forming a variable resistance layer of the variable resistance memory. For example, a stacked ReRAM in which a plurality of stacked high-permittivity insulating films are used as a variable resistance layer has good prospects in terms of, for example, compatibility with the existing LSI process and a low-current operation. In the stacked ReRAM, the memory is turned on and off by the movement of oxygen vacancies in the variable resistance layer.

In a large-capacity memory array, a plurality of metal lines which are called bit lines and word lines are arranged so as to intersect each other and memory cells are formed at the intersections between the bit lines and the word lines. Data is written to one memory cell by applying a voltage to the bit line and the word line connected to the memory cell. A plurality of memory cells, for example, tens to thousands of memory cells are connected to one bit line and one word line. Therefore, during a write operation, a voltage (a half-select voltage: a voltage lower than the voltage applied to a selected cell) is applied to a plurality of cells connected to the same bit line and word line as those connected to a write target cell (selected cell) and a current (half-select leakage current) flows to the cells. When the amount of half-select leakage current increases, the power consumption of a memory device increases. And when the amount of half-select leakage current increases, because a voltage drop in the bit lines and word lines increases, a sufficiently high voltage cannot be applied to the selected cell. For this reason, it is necessary to achieve a memory cell with a small amount of half-select leakage current in order to form a large-capacity memory array.

DETAILED DESCRIPTION

A memory device according to an embodiment includes: a first conductive layer; a second conductive layer; and a first metal oxide layer provided between the first conductive layer and the second conductive layer, the first metal oxide layer including titanium oxide, the first metal oxide layer having a first region and a second region, a mole fraction of anatase titanium oxide in the titanium oxide of the first region being a first mole fraction, a mole fraction of anatase titanium oxide in the titanium oxide of the second region being a second mole fraction lower than the first mole fraction.

Hereinafter, embodiments of the disclosure will be described with reference to the drawings. In the following description, for example, the same or similarly members denoted by the same reference numerals and the description thereof will not be repeated.

Hereinafter, the memory device according to embodiments will be described with reference to the drawings.

(First Embodiment)

A memory device according to this embodiment includes a first conductive layer, a second conductive layer, and a first metal oxide layer provided between the first conductive layer and the second conductive layer, the first metal oxide layer including titanium oxide, the first metal oxide layer having a first region and a second region, a mole fraction of anatase titanium oxide in the titanium oxide of the first region being a first mole fraction, a mole fraction of anatase titanium oxide in the titanium oxide of the second region being a second mole fraction lower than the first mole fraction.

Figure 1:
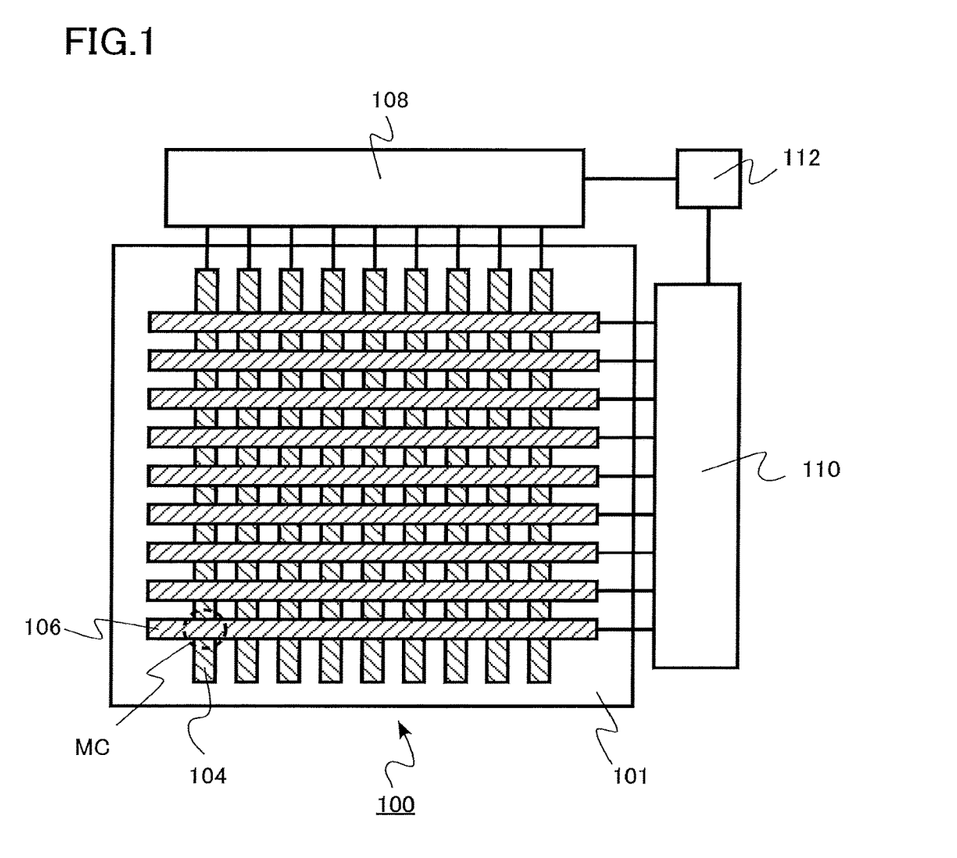
FIG. 1 is a block diagram illustrating a memory device according to a first embodiment.
Figure 2:
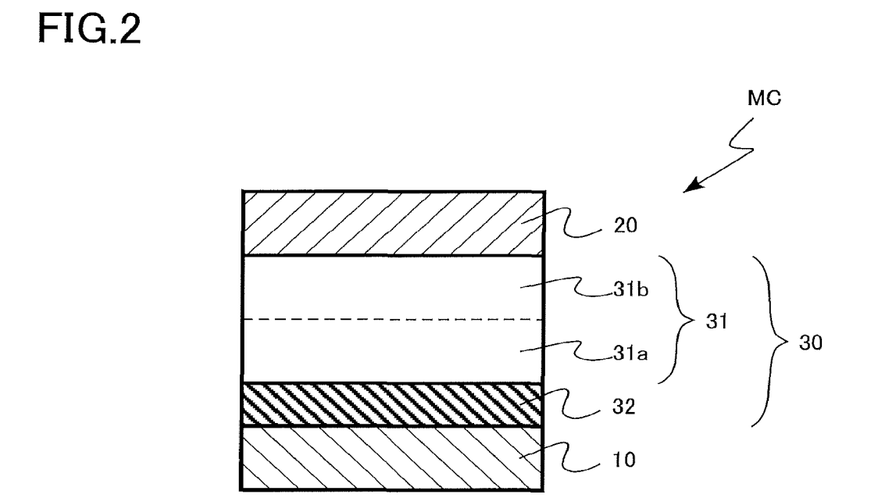
FIG. 2 is a cross-sectional view schematically illustrating a memory cell of the memory device according to the first embodiment.

FIG. 1 is a block diagram illustrating a memory cell array 100 and peripheral circuits of the memory device according to this embodiment. FIG. 2 is a cross-sectional view schematically illustrating a memory cell MC of the memory device according to this embodiment. FIG. 2 illustrates, for example, the cross section of one memory cell MC which is represented by a dotted circle in the memory cell array 100 illustrated in FIG. 1.

The memory cell array 100 of the memory device according to this embodiment includes, for example, a plurality of word lines 104 (first lines) and a plurality of bit lines 106 (second lines) intersecting the word lines 104. The word lines 104 and the bit lines 106 may be provided above the semiconductor substrate 101, with an insulating layer interposed therebetween. The bit lines 106 are provided above the word lines 104. In addition, a first control circuit 108, a second control circuit 110, and a sense circuit 112 are provided as the peripheral circuits around the memory cell array 100.

A plurality of memory cells MC are provided in regions in which the word lines 104 and the bit lines 106 intersect each other. The memory device according to this embodiment is a variable resistance memory having a cross-point structure. The memory cell MC is a variable resistance element with two terminals.

Each of the plurality of word lines 104 is connected to the first control circuit 108. In addition, each of the plurality of bit lines 106 is connected to the second control circuit 110. The sense circuit 112 is connected to the first control circuit 108 and the second control circuit 110.

The first control circuit 108 and the second control circuit 110 have, for example, a function which selects a desired memory cell MC, writes data to the memory cell, reads data from the memory cell, and erases data in the memory cell. When data is read, data in the memory cell is read as the amount of current flowing between the word line 104 and the bit line 106. The sense circuit 112 has a function which determines the amount of current and determines the polarity of data. For example, the sense circuit 112 determines whether data is "0" or "1".

The first control circuit 108, the second control circuit 110, and the sense circuit 112 are, for example, electronic circuits using semiconductor devices which are formed on the semiconductor substrate 101.

As illustrated in FIG. 2, the memory cell MC includes a lower electrode 10 (first conductive layer), an upper electrode 20 (second conductive layer), and a variable resistance layer 30.

The lower electrode 10 is connected to the word line 104. The lower electrode 10 is made of, for example, metal. The lower electrode 10 is made of, for example, titanium (Ti), tungsten (W), tantalum (Ta), platinum (Pt), or an oxide thereof. The lower electrode 10 is made of, for example, titanium nitride. The lower electrode 10 may be a portion of the word line 104.

The upper electrode 20 is connected to the bit line 106. The upper electrode 20 made of, for example, metal. The upper electrode 20 is made of, for example, titanium (Ti), tungsten (W), tantalum (Ta), platinum (Pt), or an oxide thereof. The upper electrode 20 is made of, for example, titanium nitride. The upper electrode 20 may be a portion of the bit line 106.

The variable resistance layer 30 is provided between the lower electrode 10 and the upper electrode 20. The variable resistance layer 30 includes a titanium oxide layer 31 (first metal oxide layer) and an aluminum oxide layer 32 (second metal oxide layer). The thickness of the variable resistance layer 30 is, for example, equal to or greater than 3 nm and equal to or less than 30 nm.

The titanium oxide layer 31 is provided, for example, between the aluminum oxide layer 32 and the upper electrode 20.

The titanium oxide layer 31 has titanium oxide as a main component. The mole fraction of the titanium oxide is higher than the mole fraction of each accessory component other than the titanium oxide in the titanium oxide layer 31. The mole fraction of the titanium oxide in the titanium oxide layer 31 is, for example, equal to or greater than 90%.

The crystal structure of the titanium oxide includes at least an anatase form and a rutile form. The titanium oxide layer 31 includes anatase titanium oxide, rutile titanium oxide, or amorphous titanium oxide.

The thickness of the titanium oxide layer 31 is, for example, equal to or greater than 2 nm and equal to or less than 20 nm.

The titanium oxide layer 31 has a function which modulates the number of oxygen vacancies in titanium oxide to change the resistance of the variable resistance layer 30.

The titanium oxide layer 31 includes a first region 31a and a second region 31b. The second region 31b is provided, for example, between the first region 31a and the upper electrode 20.

Each of the first region 31a and the second region 31b includes titanium oxide. The first region 31a and the second region 31b have titanium oxide as a main component. The mole fraction of the titanium oxide in the first region 31a and the second region 31b is, for example, equal to or greater than 90%.

It is defined that the mole fraction of anatase titanium oxide in the titanium oxide included in the first region 31a is a first mole fraction. In addition, it is defined that the mole fraction of anatase titanium oxide in the titanium oxide included in the second region 31b is a second mole fraction.

The second mole fraction is lower than the first mole fraction. That is, the mole fraction of anatase titanium oxide in the titanium oxide included in the second region 31b is lower than the mole fraction of anatase titanium oxide in the titanium oxide included in the first region 31a.

The amount of anatase titanium oxide in the first region 31a is more than that in the second region 31b. The mole fraction of the anatase titanium oxide may continuously change between the first region 31a and the second region 31b.

The difference between the first mole fraction and the second mole fraction is, for example, equal to or greater than 10%. In addition, the first mole fraction is, for example, equal to or greater than 70%. The second mole fraction is, for example, equal to or less than 30%.

The second region 31b includes at least one of rutile titanium oxide and amorphous titanium oxide. The second region 31b may not include the anatase titanium oxide.

The second region 31b includes, for example, the rutile titanium oxide as a main component. In addition, the second region 31b includes, for example, the amorphous titanium oxide as a main component.

The mole fraction of at least one of the rutile titanium oxide and the amorphous titanium oxide in the second region 31b is, for example, equal to or greater than 70%.

The magnitude relationship between the first mole fraction and the second mole fraction, the first mole fraction, and the second mole fraction can be determined by, for example, electron energy loss spectroscopy (EELS). For example, when anatase titanium oxide is not detected from the second region 31b, the second mole fraction is zero.

The positional relationship between the first region 31a and the second region 31b in the vertical direction may be reversed. That is, the second region 31b may be provided between the first region 31a and the lower electrode 10.

The thickness of the first region 31a and the second region 31b is, for example, equal to or greater than 1 nm and equal to or less than 10 nm.

The aluminum oxide layer 32 is provided, for example, between the lower electrode 10 and the titanium oxide layer 31. In addition, the aluminum oxide layer 32 may be provided between the titanium oxide layer 31 and the upper electrode 20.

The aluminum oxide layer 32 includes aluminum oxide as a main component. The aluminum oxide layer 32 is an example of the second metal oxide layer. The second metal oxide layer and the first metal oxide layer are made of different materials.

The second metal oxide layer is not limited to a layer including aluminum oxide. For example, the second metal oxide layer may include at least one oxide selected from the group consisting of hafnium oxide, tantalum oxide, and zirconium oxide.

The aluminum oxide layer 32 has a function which adjusts the current-voltage characteristics of the variable resistance layer 30. The thickness of the aluminum oxide layer 32 is, for example, equal to or greater than 1 nm and equal to or less than 10 nm.

Next, a method for manufacturing the memory device according to this embodiment will be described. FIGS. 3A, 3B, 3C, and 3D are diagrams illustrating the method for manufacturing the memory device according to this embodiment. FIGS. 3A, 3B, 3C, and 3D illustrate the cross section of the memory cell MC which is being manufactured.

Figure 3A:
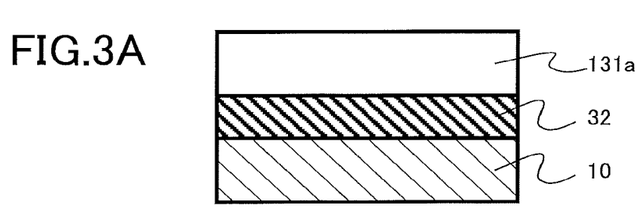
FIGS. 3A, 3B, 3C, and 3D are diagrams illustrating a method for manufacturing the memory device according to the first embodiment.

First, the lower electrode 10, the aluminum oxide layer 32, and a first amorphous titanium oxide film 131a are sequentially formed (FIG. 3A). The lower electrode 10, the aluminum oxide layer 32, and the first amorphous titanium oxide film 131a are formed by, for example, a chemical vapor deposition method (CVD method), a sputtering method, or an atomic layer deposition method (ALD method).

Figure 3B:
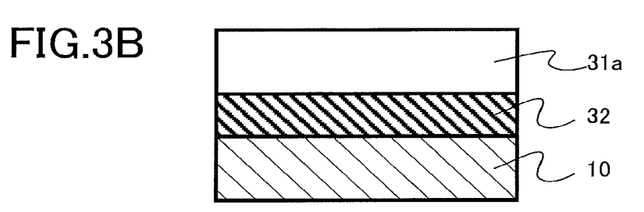

Then, a first heat treatment is performed to crystallize the first amorphous titanium oxide film 131a. The first region 31a rich in anatase titanium oxide is formed (FIG. 3B). For example, the first heat treatment is performed in an oxygen atmosphere at a temperature equal to or greater than 500° C. and equal to or less than 600° C.

Figure 3C:
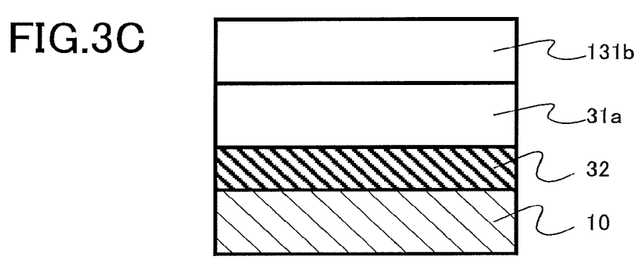

Then, a second amorphous titanium oxide film 131b is formed on the first region 31a (FIG. 3C). The second amorphous titanium oxide film 131b is formed by, for example, a CVD method, a sputtering method, or an ALD method.

Figure 3D:
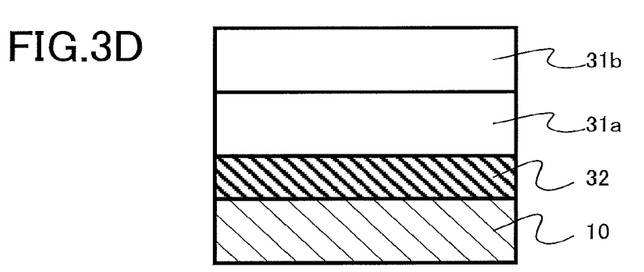

Then, a second heat treatment is performed to crystallize the second amorphous titanium oxide film 131b and the second region 31b rich in rutile titanium oxide is formed (FIG. 3D). For example, the second heat treatment is performed in a nitrogen atmosphere at a temperature equal to or greater than 400° C. and equal to or less than 500° C.

Then, the upper electrode 20 is formed. In this way, the memory cell MC according to this embodiment illustrated in FIG. 1 is manufactured.

In addition, the second heat treatment may be omitted such that the second region 31b is a region rich in amorphous titanium oxide.

Next, the function and effect of the memory device according to this embodiment will be described.

Figure 4:
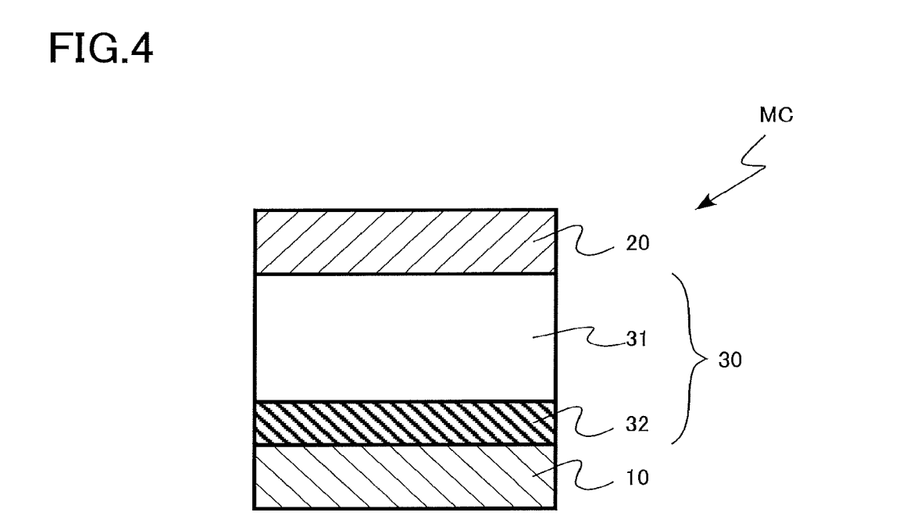
FIG. 4 is a cross-sectional view schematically illustrating a memory cell of a memory device according to a comparative example.

FIG. 4 is a cross-sectional view schematically illustrating a memory cell of a memory device according to a comparative example. The memory cell includes a lower electrode 10, an upper electrode 20, and a variable resistance layer 30. The variable resistance layer 30 includes a titanium oxide layer 31 and an aluminum oxide layer 32.

A memory cell MC according to the comparative example differs from the memory cell MC according to this embodiment in that the variable resistance layer 30 does not include the second region 31b in which the mole fraction of anatase titanium oxide is low.

Figure 5A:
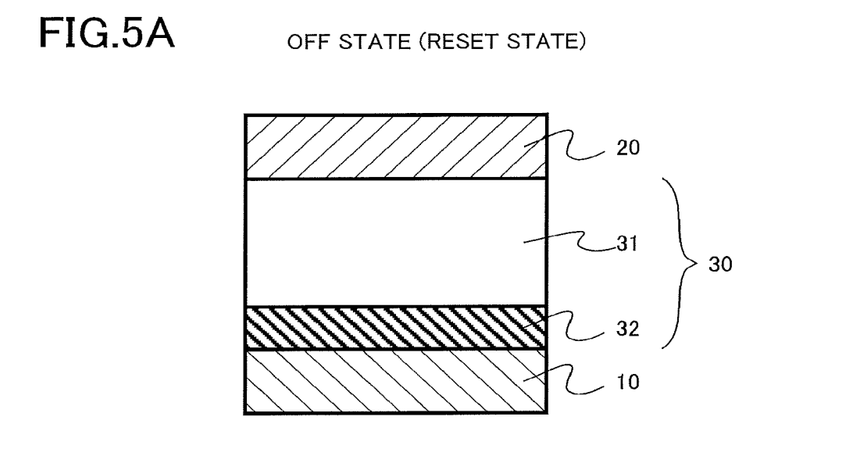
FIGS. 5A and 5B are diagrams illustrating the operation principle of the memory cell according to the comparative example.
Figure 5B:
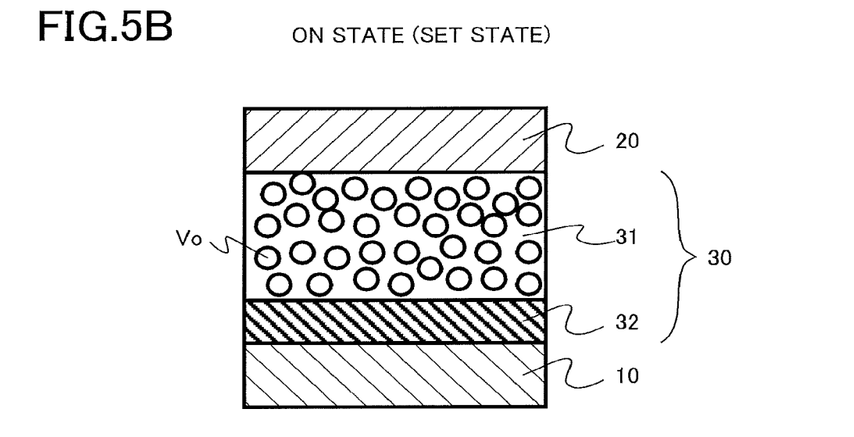

FIGS. 5A and 5B are diagrams illustrating the operation principle of the memory cell according to the comparative example. In the memory cell MC according to the comparative example, when a voltage is applied to the variable resistance layer 30, the variable resistance layer 30 is changed from a high-resistance state to a low-resistance state or from a low-resistance state to a high-resistance state. The change from the high-resistance state to the low-resistance state is referred to as, for example, a set operation. The change from the low-resistance state to the high-resistance state is referred to as, for example, a reset operation.

The high-resistance state is also referred to as an off state or a reset state. In addition, the low-resistance state is also referred to as an on state or a set state.

When a positive voltage is applied to the upper electrode 20 in the memory cell MC in the off state illustrated in FIG. 5A, oxygen vacancies (Vo in FIG. 5B) occur in the titanium oxide layer 31 as illustrated in FIG. 5B and the memory cell MC changes to an on state. The on state is maintained even when the voltage drops to 0 V.

When a positive voltage is applied to the lower electrode 10 in the memory cell MC in the on state illustrated in FIG. 5B, the oxygen vacancies in the titanium oxide layer 31 disappear and the memory cell MC changes to the off state illustrated in FIG. 5A.

For example, the off state is defined as data "0" and the on state is defined as data "1". The memory cell MC can store one set of data "0" and data "1".

Figure 6:
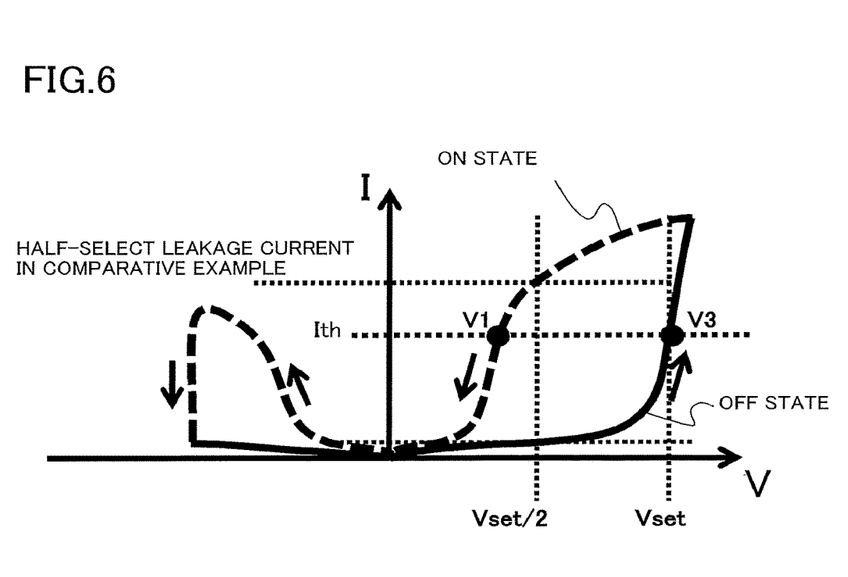
FIG. 6 is a diagram illustrating the current-voltage characteristics of the memory cell according to the comparative example.

FIG. 6 is a diagram illustrating the current-voltage characteristics (IV characteristics) of the memory cell according to the comparative example. When a positive voltage is applied to the upper electrode 20 in the memory cell in an off state, the amount of current increases at a voltage V3 and the memory cell changes to an on state. The voltage V3 is referred to as a voltage before set operation. The voltage V3 is also simply referred to as a set voltage Vset.

After the set operation is performed and the memory cell changes to the on state and when a positive voltage is applied to the upper electrode 20, the amount of current increases at a voltage V1 lower than the voltage V3. The voltage V1 is referred to as a voltage after set operation.

Figure 7:
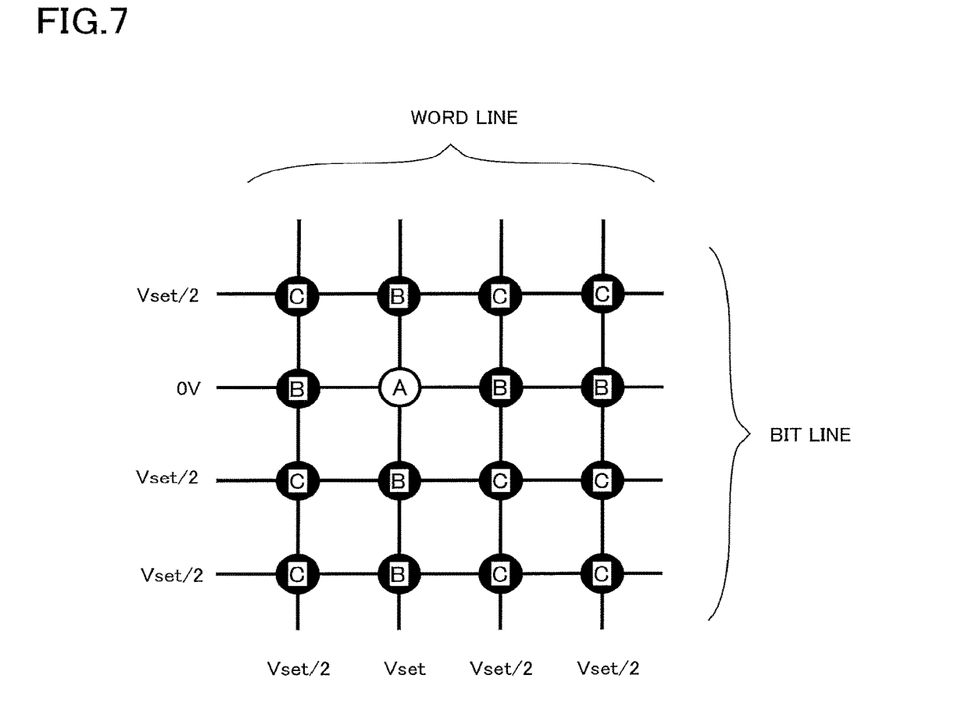
FIG. 7 is a diagram illustrating the task of the memory device according to the first embodiment.

FIG. 7 is a diagram illustrating the task of the memory device according to this embodiment. FIG. 7 illustrates the voltage that is applied to the memory cell when one memory cell is selected from the memory cell array for the set operation.

Each intersection point between the word lines and the bit lines indicates each memory cell.

The selected memory cell is a memory cell A (selected cell). The set voltage Vset is applied to the word line connected to the memory cell A. In addition, 0 V is applied to the bit line connected to the memory cell A.

Next, an example in which a voltage (Vset/2) that is half the set voltage is applied to the word lines and the bit lines which are not connected to the memory cell A will be described.

A voltage of 0 V is applied to memory cells C (non-selected cells) connected to the word lines and the bit lines which are not connected to the memory cell A. That is, no voltage is applied.

In contrast, the voltage (Vset/2) that is half the set voltage Vset is applied to memory cells B (half-selected cells) connected to the word line or the bit line which is connected to the memory cell A. Therefore, a half-select leakage current illustrated in FIG. 6 flows to the memory cell B (half-selected cell).

When the amount of half-select leakage current increases, the power consumption of a chip increases. In addition, a voltage drop in the bit lines or word lines increases and a sufficiently high voltage is not applied to the selected cell. As a result, a write operation is unstable.

A first sample and a second sample having the memory cell structure according to the comparative example are prepared. The titanium oxide layer 31 of the first sample includes only anatase titanium oxide and the titanium oxide layer 31 of the second sample includes a mixture of anatase titanium oxide and rutile titanium oxide are created. For the first sample and the second sample, a change in the voltage V1 illustrated in FIG. 6 with time after set operation is examined.

In the second sample in which the mole fraction of the anatase titanium oxide is low, the voltage V1 after set operation returns to about 90% of the voltage V3 after five hours from the set operation. That is, the low-resistance state is unstable. In contrast, in the first sample in which the mole fraction of the anatase titanium oxide is high, the voltage V1 after set operation is equal to or less than 30% of the voltage V3 even after three days from the set operation. That is, the low-resistance state is stable.

In an another sample in which the titanium oxide layer 31 includes amorphous titanium oxide, the low-resistance state is unstable, similarly to the second sample.

The above-mentioned results of the experiment prove that, in the titanium oxide in which the mole fraction of anatase titanium oxide is low, oxygen vacancies are unstable and are likely to disappear. In contrast, the results prove that, in the titanium oxide in which the mole fraction of anatase titanium oxide is high, oxygen vacancies are stable and are less likely to disappear.

Figure 8A:
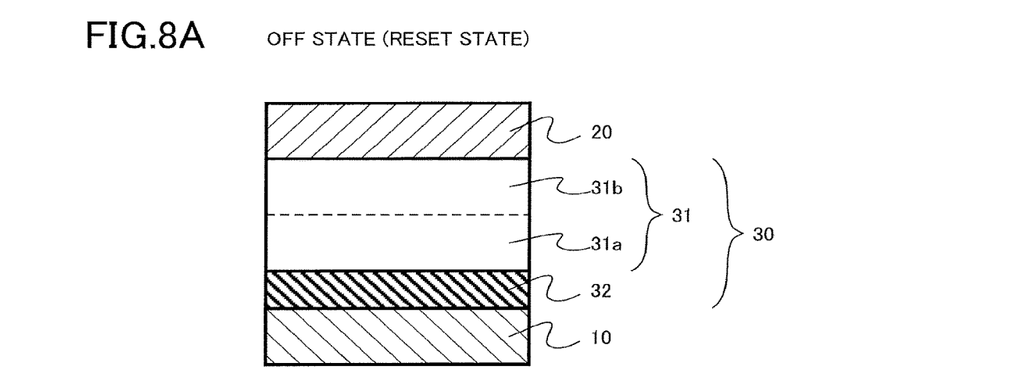
FIGS. 8A, 8B, and 8C are diagrams illustrating operation principle of the memory cell of the memory device according to the first embodiment.
Figure 8B:
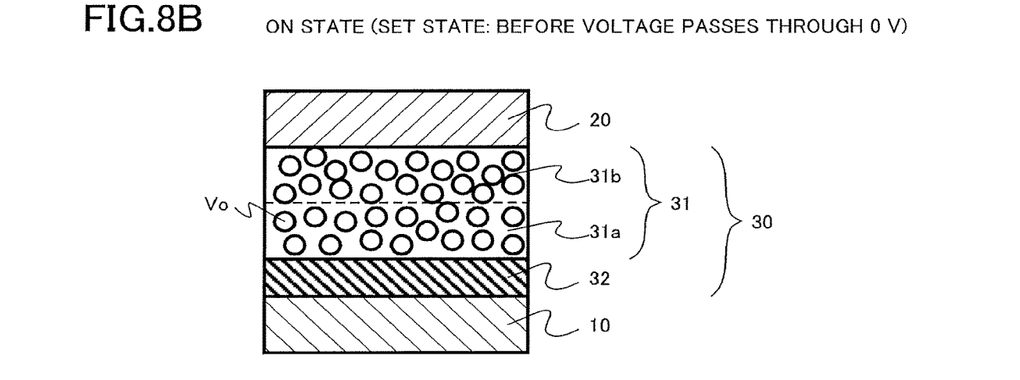
Figure 8C:
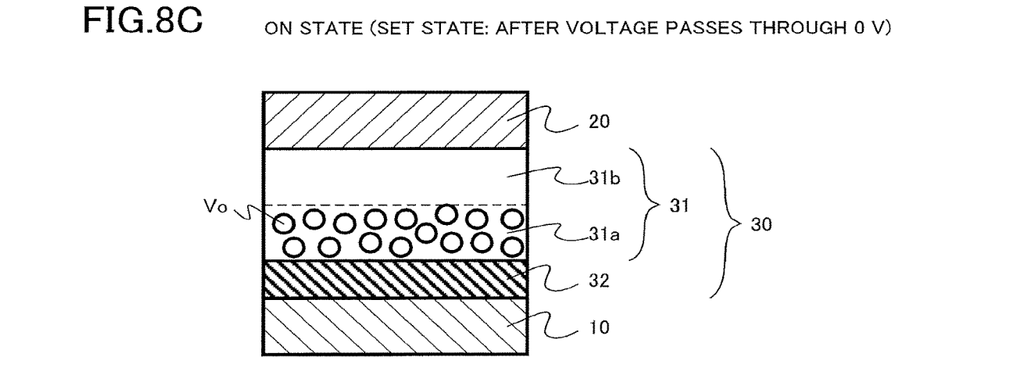

FIGS. 8A, 8B, and 8C are diagrams illustrating the operation principle of the memory cell according to this embodiment.

When a positive voltage is applied to the upper electrode 20 of the memory cell MC in the off state illustrated in FIG. 8A, oxygen vacancies (Vo in FIG. 8B) occur in the titanium oxide layer 31 as illustrated in FIG. 8B and the memory cell MC changes to anon state. Then, the voltage drops to 0 V. Then, as illustrated in FIG. 8C, in the second region 31b in which the mole fraction of the anatase titanium oxide is low, the oxygen vacancies are unstable and disappear.

In the state illustrated in FIG. 8C, the resistance of the variable resistance layer 30 is in an intermediate state between the off state illustrated in FIG. 8A and the on state (before the voltage passes through 0 V) illustrated in FIG. 8B. The intermediate state is maintained even when the voltage drops 0 V.

Then, when a positive voltage is applied to the lower electrode 10 of the memory cell MC in the on state (after the voltage passes through 0 V) illustrated in FIG. 8C, the oxygen vacancies in the titanium oxide layer 31 disappear and the memory cell MC changes to the off state illustrated in FIG. 8A.

Figure 9:
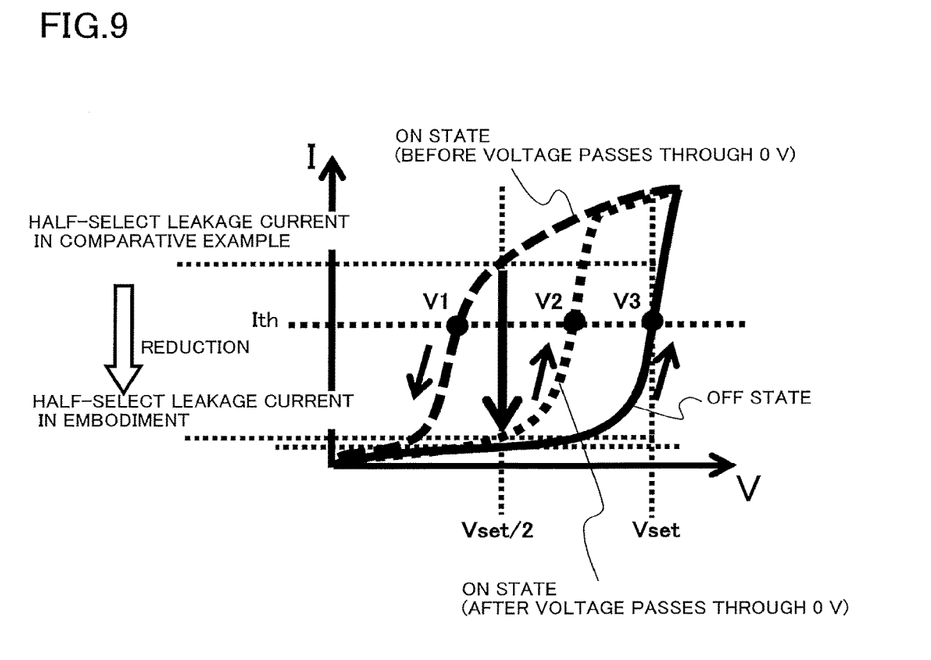
FIG. 9 is a diagram illustrating the current-voltage characteristics of the memory cell according to the first embodiment.

FIG. 9 is a diagram illustrating the current-voltage characteristics (IV characteristics) of the memory cell according to this embodiment. In the on state after the voltage passes through 0 V, the memory cell changes to the intermediate state, the current-onset voltage increases from V1 to V2. Therefore, the amount of half-select leakage current which flows at a voltage (Vset/2) that is half the set voltage Vset is significantly less than that in the comparative example.

In addition, the current-onset voltage in the on state is higher than that in the comparative example. However, since a read voltage is set to be higher than the current-onset voltage V2, it is possible to obtain a sufficiently large amount of read current. According to the memory device of this embodiment, it is possible to achieve a stable read operation and to reduce the amount of half-select leakage current.

In order to sufficiently reduce the amount of half-select leakage current, the difference between the mole fraction (first mole fraction) of anatase titanium oxide in the titanium oxide included in the first region 31a and the mole fraction (second mole fraction) of anatase titanium oxide in the titanium oxide included in the second region 31b is preferably equal to or greater than 10%, more preferably equal to or greater than 20%, and most preferably equal to or greater than 30%.

In order to sufficiently reduce the amount of half-select leakage current, the second mole fraction is preferably equal to or less than 30%, more preferably equal to or less than 20%, and most preferably equal to or less than 10%.

In order to sufficiently increase the amount of current during a read operation, the first mole fraction is preferably equal to or greater than 70°, more preferably equal to or greater than 80%, and most preferably equal to or greater than 90%.

As described above, according to this embodiment, it is possible to reduce the amount of half-select leakage current. Therefore, power consumption is reduced and a variable resistance memory with a stable write operation is achieved.

(Second Embodiment)

A memory device according to this embodiment is the same as the memory device according to the first embodiment except that the memory cell array has a three-dimensional structure. Therefore, the description of the same content as that in the first embodiment will not be repeated.

Figure 10:
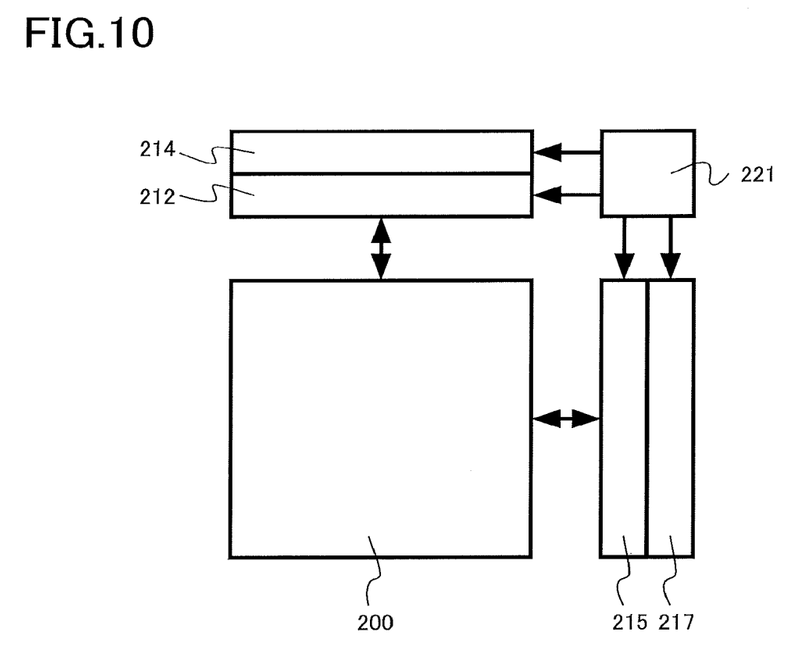
FIG. 10 is a block diagram illustrating a memory device according to a second embodiment.
Figure 11:
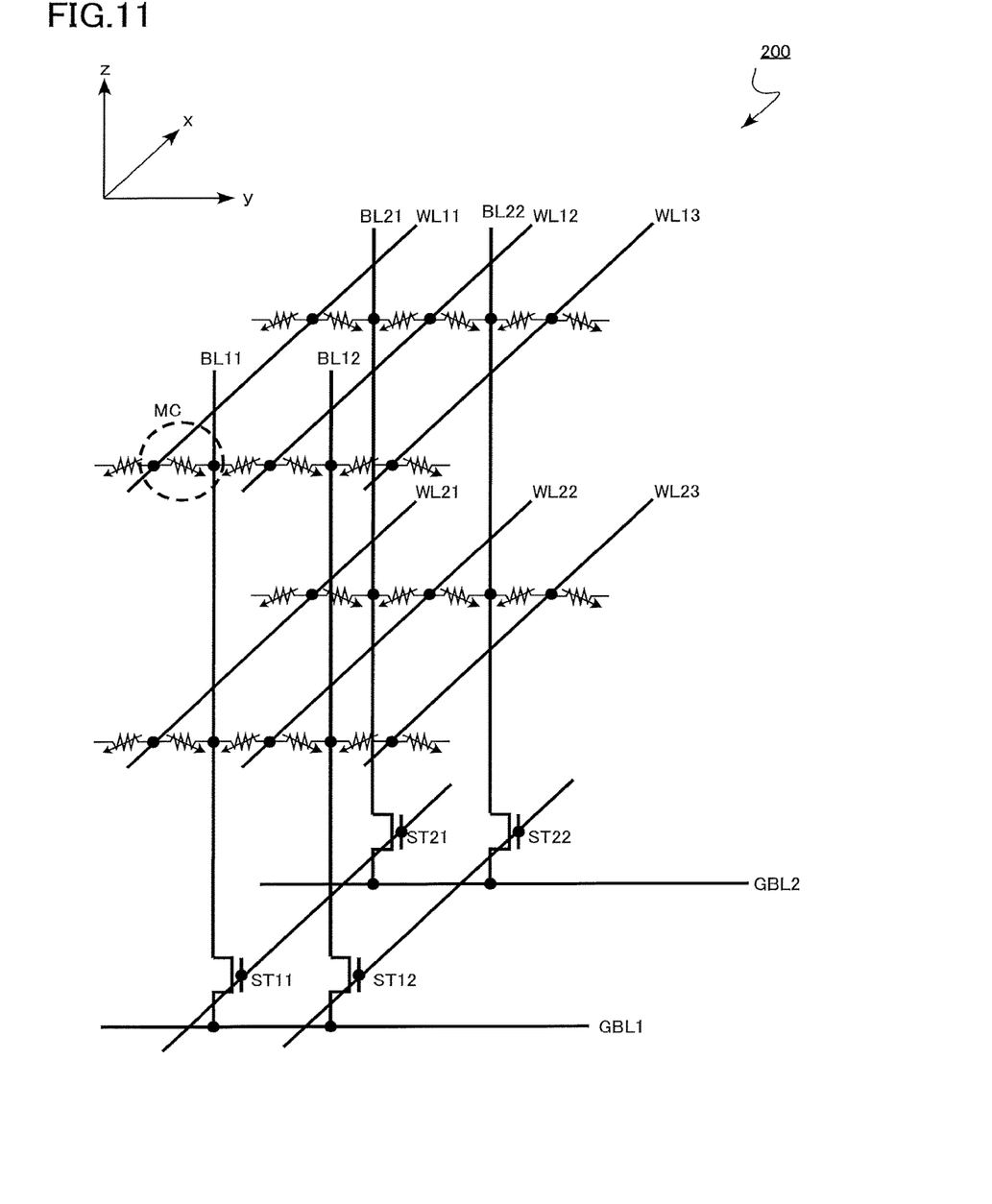
FIG. 11 is an equivalent circuit diagram illustrating a memory cell array according to the second embodiment.
Figure 12A:
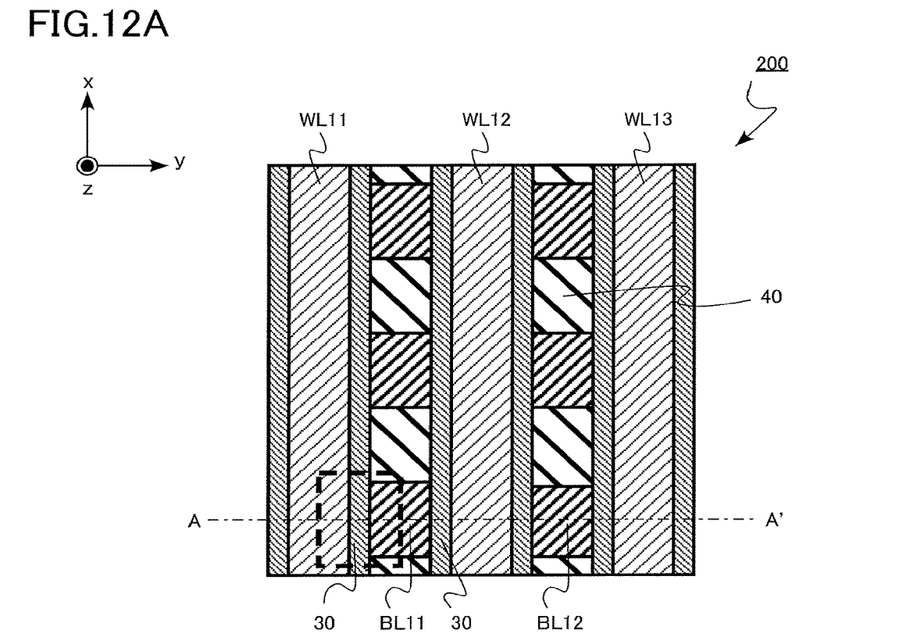
FIGS. 12A and 12B are cross-sectional views schematically illustrating the memory cell array according to the second embodiment.
Figure 12B:
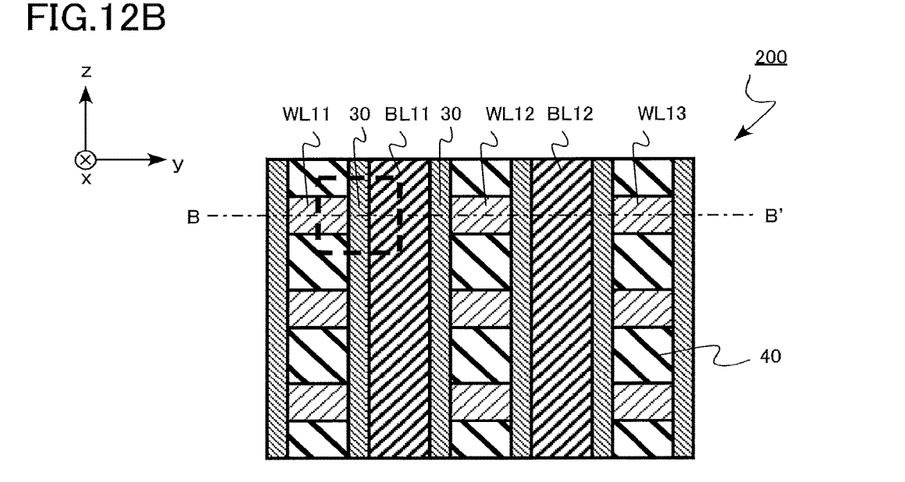

FIG. 10 is a block diagram illustrating the memory device according to this embodiment. FIG. 11 is an equivalent circuit diagram illustrating a memory cell array. FIGS. 12A and 12B are cross-sectional views schematically illustrating the memory cell array.

The memory cell array according to this embodiment has a three-dimensional structure in which memory cells MC are three-dimensionally disposed.

As illustrated in FIG. 10, the memory device includes a memory cell array 200, a word line driver circuit 212, a row decoder circuit 214, a sense amplifier circuit 215, a column decoder circuit 217, and a control circuit 221.

As illustrated in FIG. 11, a plurality of memory cells MC are three-dimensionally disposed in the memory cell array 200. In FIG. 11, a region surrounded by a dashed line corresponds to one memory cell MC.

The memory cell array 200 includes, for example, a plurality of word lines WL (WL11, WL12, WL13, WL21, WL22, and WL23) (first lines) and a plurality of bit lines BL (BL11, BL12, BL21, and BL22) (second lines). The word line WL extends in the x direction. The bit line BL extends in the z direction. The word line WL and the bit line BL perpendicularly intersect each other. The memory cell MC is disposed in an intersection portion between the word line WL and the bit line BL.

The plurality of word lines WL are electrically connected to the row decoder circuit 214. The plurality of bit lines BL are connected to the sense amplifier circuit 215. Select transistors ST (ST11, ST21, ST12, and ST22) and global bit lines GBL (GBL1 and GBL2) are provided between the plurality of bit lines BL and the sense amplifier circuit 215.

The row decoder circuit 214 has a function which selects the word line WL on the basis of an input row address signal. The word line driver circuit 212 has a function which applies a predetermined voltage to the word line WL selected by the row decoder circuit 214.

The column decoder circuit 217 has a function which selects the bit line BL on the basis of an input column address signal. The sense amplifier circuit 215 has a function which applies a predetermined voltage to the bit line BL selected by the column decoder circuit 217. In addition, the sense amplifier circuit 215 has a function which detects the current flowing between the selected word line WL and the selected bit line BL and amplifies the current.

The control circuit 221 has a function which controls the word line driver circuit 212, the row decoder circuit 214, the sense amplifier circuit 215, the column decoder circuit 217, and other circuits (not illustrated).

Circuits, such as the word line driver circuit 212, the row decoder circuit 214, the sense amplifier circuit 215, the column decoder circuit 217, and the control circuit 221, are formed by, for example, transistors using semiconductor layers (not illustrated) or wiring layers.

FIGS. 12A and 12B are cross-sectional views schematically illustrating the memory cell array 200 of the memory device according to this embodiment. FIG. 12A is an xy cross-sectional view illustrating the memory cell array 200. FIG. 12B is a yz cross-sectional view illustrating the memory cell array 200. FIG. 12A is a cross-sectional view taken along the line BB' of FIG. 12B and FIG. 12B is a cross-sectional view taken along the line AA' of FIG. 12A. In FIGS. 12A and 12B, a region surrounded by a dashed line corresponds to one memory cell MC.

The memory cell array 200 includes the word line WL11, the word line WL12, the word line WL13, the bit line BL11, and the bit line BL12. In addition, the memory cell array 200 includes a variable resistance layer 30 and an interlayer insulating layer 40. The variable resistance layer 30 according to the first embodiment is applied to the variable resistance layer 30.

According to this embodiment, since the memory device has the three-dimensional structure, it is possible to obtain the effect of improving the degree of integration of the memory device, in addition to the effect obtained by the first embodiment.

While certain embodiments have been described, these embodiments have been presented by way of example only, and are not intended to limit the scope of the inventions. Indeed, the memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A memory device comprising:
a first conductive layer;
a second conductive layer; and
a first metal oxide layer provided between the first conductive layer and the second conductive layer, the first metal oxide layer including titanium oxide, the first metal oxide layer having a first region and a second region, a mole fraction of anatase titanium oxide in the titanium oxide of the first region being a first mole fraction, a mole fraction of anatase titanium oxide in the titanium oxide of the second region being a second mole fraction lower than the first mole fraction.

2. The memory device according to claim 1, wherein a difference between the first mole fraction and the second mole fraction is equal to or greater than 10%.

3. The memory device according to claim 1, wherein the first mole fraction is equal to or greater than 70%.

4. The memory device according to claim 1, wherein the second mole fraction is equal to or less than 30%.

5. The memory device according to claim 1, wherein the second region includes rutile titanium oxide.

6. The memory device according to claim 1, wherein the second region includes amorphous titanium oxide.

7. The memory device according to claim 1, further comprising:
a second metal oxide layer provided between the first metal oxide layer and either of the first conductive layer and the second conductive layer, a material of the second metal oxide layer being different from a material of the first metal oxide layer.

8. The memory device according to claim 7, wherein the second metal oxide layer includes at least one oxide selected from the group consisting of aluminum oxide, hafnium oxide, tantalum oxide, and zirconium oxide.

9. A memory device comprising:
a plurality of first lines;
a plurality of second lines intersecting the first lines; and
a memory cell provided between one of the first lines and one of the second lines,
wherein the memory cell includes a first metal oxide layer,
the first metal oxide layer includes titanium oxide,
the first metal oxide layer has a first region and a second region, and
a mole fraction of anatase titanium oxide in the titanium oxide of the first region is a first mole fraction and a mole fraction of anatase titanium oxide in the titanium oxide of the second region is a second mole fraction lower than the first mole fraction.

10. The memory device according to claim 9, wherein a difference between the first mole fraction and the second mole fraction is equal to or greater than 10%.

11. The memory device according to claim 9, wherein the first mole fraction is equal to or greater than 70%.

12. The memory device according to claim 9, wherein the second mole fraction is equal to or less than 30%.

13. The memory device according to claim 9, wherein the second region includes rutile titanium oxide.

14. The memory device according to claim 9, wherein the second region includes amorphous titanium oxide.

15. The memory device according to claim 9, wherein the memory cell includes a second metal oxide layer provided between the first metal oxide layer and either of the one of the first lines and the one of the second lines, a material of the second metal oxide layer being different from a material of the first metal oxide layer.

16. The memory device according to claim 15,
wherein the second metal oxide layer includes at least one oxide selected from the group consisting of aluminum oxide, hafnium oxide, tantalum oxide, and zirconium oxide.

17. A memory device comprising:
a first conductive layer;
a second conductive layer; and
a first metal oxide layer provided between the first conductive layer and the second conductive layer, the first metal oxide layer including titanium oxide, the first metal oxide layer having a first region and a second region, an oxygen vacancy being more unstable in the second region than in the first region,
wherein the first region includes anatase titanium oxide and the second region includes at least one of rutile titanium oxide and amorphous titanium oxide.

* * * * *